(12) United States Patent
Wamura et al.

(10) Patent No.: US 9,103,029 B2
(45) Date of Patent: Aug. 11, 2015

(54) PROCESSING APPARATUS AND FILM FORMING METHOD

(75) Inventors: Yu Wamura, Nirasaki (JP); Yuichiro Morozumi, Nirasaki (JP); Izumi Sato, Oshu (JP); Shinji Asari, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 180 days.

(21) Appl. No.: 13/161,874

(22) Filed: Jun. 16, 2011

(65) Prior Publication Data

US 2011/0312188 A1    Dec. 22, 2011

(30) Foreign Application Priority Data

Jun. 18, 2010  (JP) ................. 2010-139146

(51) Int. Cl.
C23C 16/44 (2006.01)
C23C 16/455 (2006.01)
C23C 16/52 (2006.01)
H01L 21/673 (2006.01)

(52) U.S. Cl.
CPC ....... *C23C 16/4412* (2013.01); *C23C 16/45546* (2013.01); *C23C 16/52* (2013.01); *H01L 21/67303* (2013.01)

(58) Field of Classification Search
CPC ............ H01L 21/673; H01L 21/67303; H01L 21/67309; H01L 21/6732; C23C 16/4412; C23C 16/45546; C23C 16/52
USPC ................ 118/724, 728; 156/345.37, 345.51
See application file for complete search history.

(56) References Cited

U.S. PATENT DOCUMENTS 5,503,875 A    4/1996  Imai et al.
6,165,916 A   12/2000  Muraoka et al.
7,758,920 B2   7/2010  Hasebe et al.
(Continued)

FOREIGN PATENT DOCUMENTS

CN    1908228 A    2/2007
JP    64-049218 A  *  8/1987
(Continued)

OTHER PUBLICATIONS

Singapore Search and Examination Report dated Aug. 21, 2012.
(Continued)

*Primary Examiner* — Karla Moore
*Assistant Examiner* — Benjamin Kendall
(74) *Attorney, Agent, or Firm* — Burr & Brown, PLLC

(57) ABSTRACT

A processing apparatus for processing objects, includes: a processing container structure having a bottom opening and including a processing container having a processing space for housing the objects, the container having a nozzle housing area on one side of the processing space and a slit-like exhaust port on the opposite side of the processing space from the nozzle housing area; a lid for closing the bottom opening of the processing container structure; a support structure for supporting the objects and which can be inserted into and withdrawn from the processing container structure; a gas introduction means including a gas nozzle housed in the nozzle housing area; an exhaust means including a plurality of exhaust systems for exhausting the atmosphere in the processing container structure; a heating means for heating the objects; and a control means for controlling the gas introduction means, the exhaust means and the heating means.

10 Claims, 10 Drawing Sheets

(56) References Cited

U.S. PATENT DOCUMENTS

| | | |
|---|---|---|
| 7,807,587 B2 * | 10/2010 | Matsuura et al. ............ 438/800 |
| 2003/0049372 A1 * | 3/2003 | Cook et al. ................ 427/248.1 |
| 2005/0287806 A1 * | 12/2005 | Matsuura ..................... 438/680 |
| 2008/0014351 A1 | 1/2008 | Inoue |
| 2008/0090415 A1 | 4/2008 | Maeda et al. |
| 2008/0132084 A1 | 6/2008 | Miya et al. |
| 2008/0213479 A1 * | 9/2008 | Chou et al. ............ 427/255.393 |
| 2009/0061651 A1 | 3/2009 | Nakashima et al. |
| 2010/0275848 A1 * | 11/2010 | Fukuda et al. ................ 118/728 |
| 2011/0203524 A1 * | 8/2011 | Uno .............................. 118/730 |

FOREIGN PATENT DOCUMENTS

| | | |
|---|---|---|
| JP | 06-045256 A1 | 2/1994 |
| JP | 06-275608 A1 | 9/1994 |
| JP | 11-087341 A1 | 3/1999 |
| JP | 2004-006551 A1 | 1/2004 |
| JP | 2006179819 A * | 7/2006 |
| JP | 2008-227460 A1 | 9/2008 |
| JP | 2010-080657 A | 4/2010 |

OTHER PUBLICATIONS

Chinese Office Action, Chinese Application No. 201110168440.4, dated Apr. 11, 2014 (7 pages).

* cited by examiner

PROCESSING APPARATUS AND FILM FORMING METHOD

CROSS-REFERENCE TO RELATED APPLICATION

This application claims the benefit of Japanese Patent Application No. 2010-139146, filed on Jun. 18, 2010, the disclosure of which is incorporated herein by reference in its entirety.

BACKGROUND OF THE INVENTION

1. Field of the Invention

The present invention relates to a support structure for supporting processing objects, such as semiconductor wafers, and to a processing apparatus.

2. Description of the Related Art

In the manufacturing of a semiconductor integrated circuit, a semiconductor wafer, e.g. comprised of a silicon substrate, is generally subjected to various types of processing, such as film-forming processing, etching, oxidation, diffusion processing, modification, removal of a natural oxide film, etc. Such processing is carried out by using a single-wafer processing apparatus which processes wafers in a one-by-one manner, or a batch processing apparatus which processes a plurality of wafers at a time. When processing of a semiconductor wafer is carried out, for example, by using a vertical batch processing apparatus as disclosed, for example, in Japanese Patent Laid-Open Publication No. H6-275608, semiconductor wafers are first transferred from a cassette, which can house a plurality of, e.g. about 25, wafers, to a vertical wafer boat where the wafers are supported in multiple stages.

The wafer boat can generally hold about 30 to 150 wafers, depending on the wafer size. After the wafer boat, housing wafers therein, is loaded into an evacuable processing container from below, the interior of the processing container is kept airtight. A predetermined heat treatment of the wafers is then carried out while controlling processing conditions, such as the flow rate of a processing gas, the processing pressure, the processing temperature, etc. Taking film-forming processing as an example of heat treatment, known film-forming methods include CVD (chemical vapor deposition) (Japanese Patent Laid-Open Publication No. 2004-006551) and ALD (atomic layer deposition).

For the purpose of improving the characteristics of circuit elements, a demand exists for reducing heat history in the process of manufacturing a semiconductor integrated circuit. An ALD method, which involves intermittently supplying a raw material gas, etc. so as to repeatedly form one layer to a few layers of a film at the atomic or molecular level and which is capable of performing intended processing without exposing wafers to excessively high temperatures, is therefore becoming more frequently used (Japanese Patent Laid-Open Publications Nos. H6-45256 and H11-87341).

SUMMARY OF THE INVENTION

It is an object of the present invention to provide a processing apparatus and a film forming method which, owing to their enhanced evacuation capacity, can quickly and efficiently bring the interior of a processing container to a reduced pressure atmosphere even when a gas is supplied at a high flow rate into the processing container.

In order to achieve the object, the present invention provides a processing apparatus for carrying out predetermined processing of a plurality of processing objects, comprising: a processing container structure having a bottom opening and including a processing container having a processing space for housing the processing objects, the processing container having a nozzle housing area on one side of the processing space and a slit-like exhaust port on the opposite side of the processing space from the nozzle housing area; a lid for closing the bottom opening of the processing container structure; a support structure for supporting the processing objects and which can be inserted into and withdrawn from the processing container structure; a gas introduction means including a gas nozzle housed in the nozzle housing area; an exhaust means including a plurality of exhaust systems for exhausting the atmosphere in the processing container structure; a heating means for heating the processing objects; and a control means for controlling the gas introduction means, the exhaust means and the heating means.

With the provision of the exhaust means including the plurality of exhaust systems for evacuation of the atmosphere in the processing container, it becomes possible to enhance the evacuation capacity of the processing apparatus. It therefore becomes possible to quickly and efficiently bring the interior of the processing container to a reduced pressure atmosphere even when a gas is supplied at a high flow rate into the processing container.

The present invention also provides a film forming method for forming a film on a plurality of processing objects by using a processing apparatus comprising: a processing container structure having a bottom opening and including a processing container having a processing space for housing the processing objects, the processing container having a nozzle housing area on one side of the processing space and a slit-like exhaust port on the opposite side of the processing space from the nozzle housing area; a lid for closing the bottom opening of the processing container structure; a support structure for supporting the processing objects and which can be inserted into and withdrawn from the processing container structure; a gas introduction means including a gas nozzle housed in the nozzle housing area; an exhaust means including a plurality of exhaust systems for exhausting the atmosphere in the processing container structure; a heating means for heating the processing objects; and a control means for controlling the gas introduction means, the exhaust means and the heating means, the film forming method comprising carrying out a first step of supplying a raw material gas into the processing container and a second step of supplying a reactive gas, which is reactive with the raw material gas, into the processing container alternately and repeatedly, with a purge step of supplying a purge gas into the processing container to exhaust the remaining gas being interposed between each first step and each second step, wherein in the first or second step, the atmosphere in the processing container is exhausted by using at least one of the plurality of exhaust systems and, in the purge step, the atmosphere in the processing container is exhausted by using at least one other exhaust system of the plurality of exhaust systems.

According to the present invention, with the provision of the exhaust means including the plurality of exhaust systems for evacuation of the atmosphere in the processing container, it becomes possible to enhance the evacuation capacity, making it possible to quickly and efficiently bring the interior of the processing container to a reduced pressure atmosphere even when a gas is supplied at a high flow rate into the processing container.

DETAILED DESCRIPTION OF THE INVENTION

Preferred embodiments of a processing apparatus and a film forming method according to the present invention will now be described in detail with reference to the drawings.

First Embodiment

Figure 1:
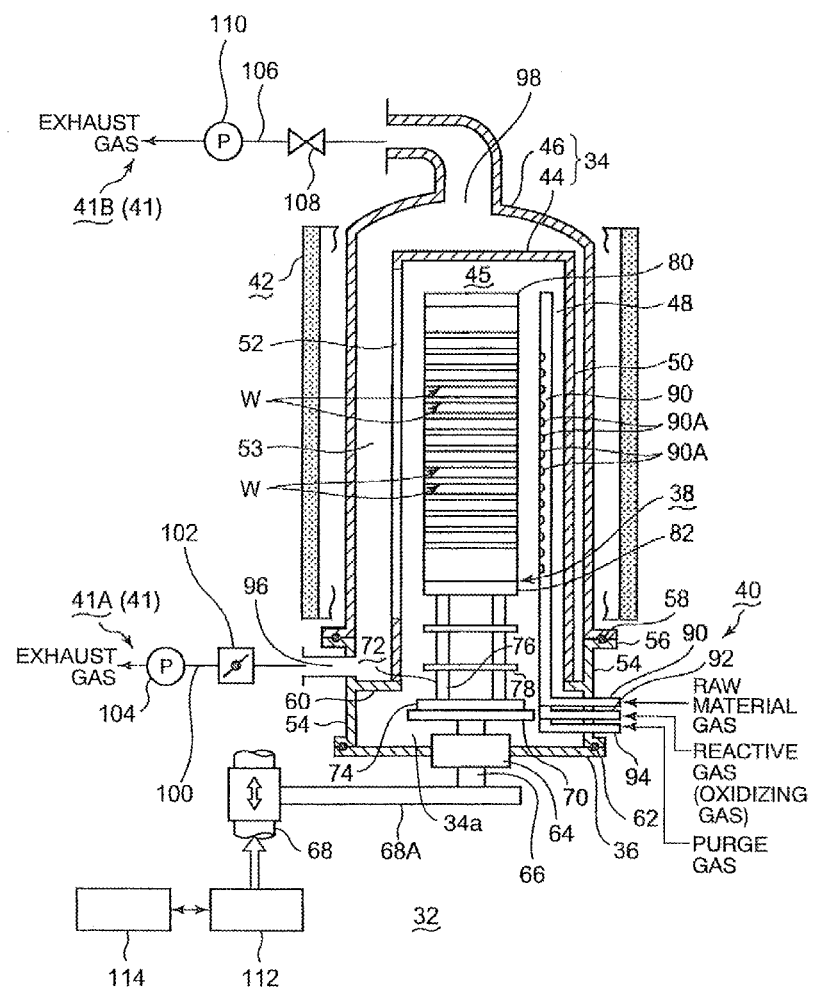
FIG. 1 is a vertical sectional view of a processing apparatus according to a first embodiment of the present invention.
Figure 2:
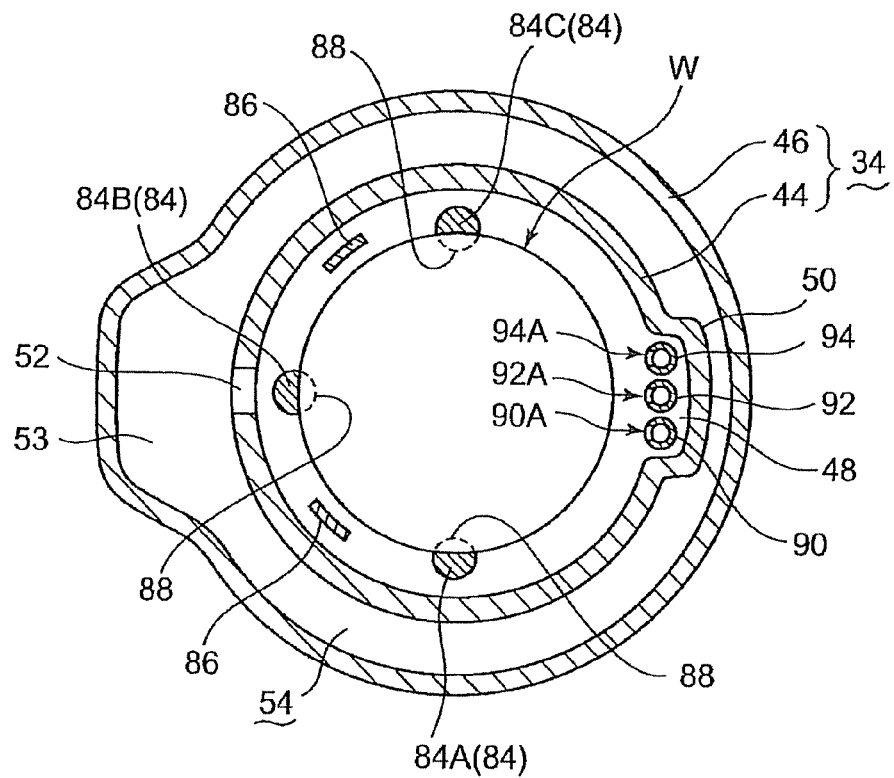
FIG. 2 is a cross-sectional view of a processing container structure portion of the processing apparatus.
Figure 3:
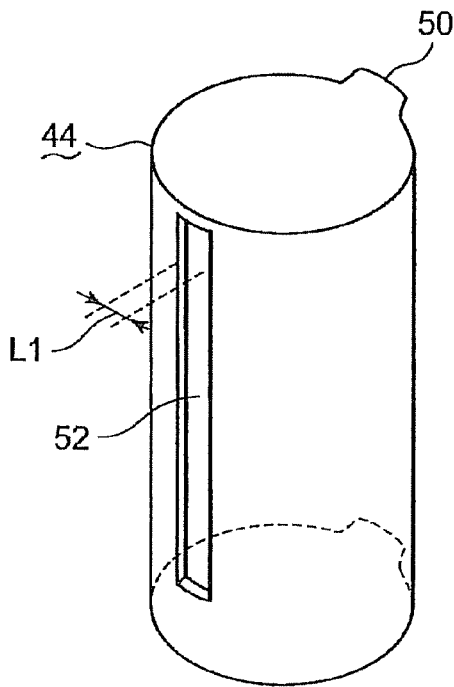
FIG. 3 is a perspective view of a processing container.
Figure 4:
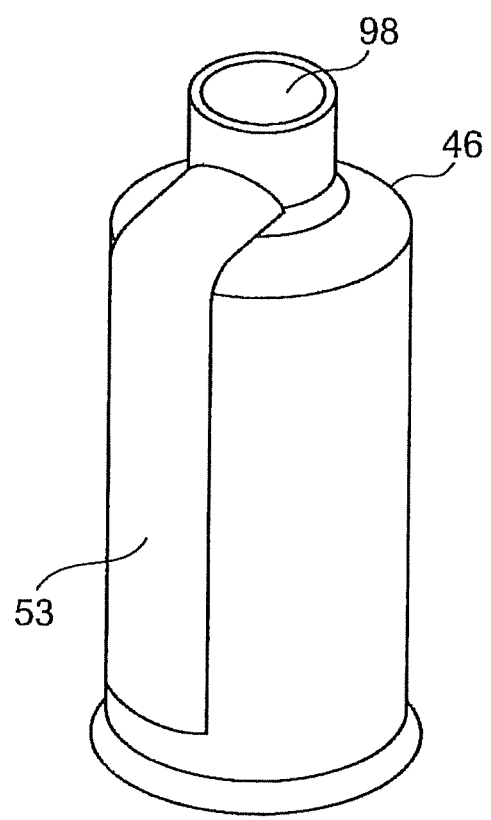
FIG. 4 is a perspective view of a cover container.
Figure 5:
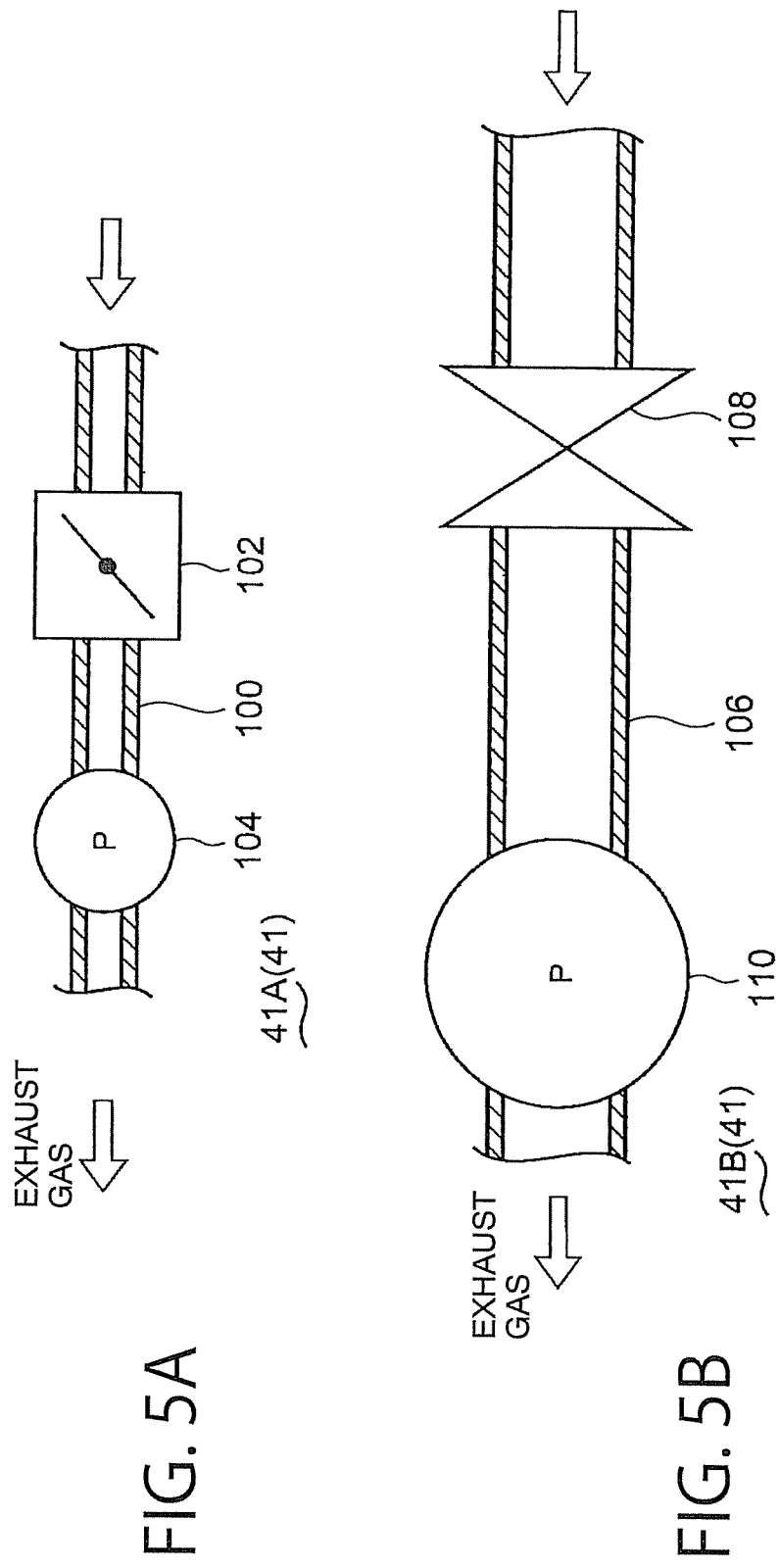
FIGS. 5A and 5B are diagrams illustrating an exhaust means including a plurality of exhaust systems.

FIG. 1 is a vertical sectional view of a processing apparatus according to a first embodiment of the present invention; FIG. 2 is a cross-sectional view of a processing container structure portion of the processing apparatus; FIG. 3 is a perspective view of a processing container; FIG. 4 is a perspective view of a cover container; and FIGS. 5A and 5B are diagrams illustrating an exhaust means including a plurality of exhaust systems.

The following description illustrates an exemplary case in which the processing apparatus performs film-forming processing to form a film on a semiconductor wafer as a processing object. As shown in FIG. 1, the processing apparatus 32 mainly comprises a processing container structure 34 for housing processing objects and which has a bottom opening 34a, a lid 36 for hermetically closing the bottom opening 34a at the lower end of the processing container structure 34, a support structure (wafer boat) 38 for supporting a plurality of semiconductor wafers W as processing objects at a predetermined pitch and which is to be inserted into and withdrawn from the processing container structure 34, a gas introduction means 40 for introducing a necessary gas into the processing container structure 34, an exhaust means 41 for exhausting the atmosphere in the processing container structure 34, and a heating means 42 for heating the semiconductor wafers W. The present invention is characterized in that the exhaust means 41 includes a plurality of exhaust systems, and in this embodiment includes two exhaust systems, a first exhaust system 41A and a second exhaust system 41B.

The processing container structure 34 is mainly comprised of a cylindrical processing container 44 with a closed top and an open bottom, and a cylindrical cover container 46 with a closed top and an open bottom, surrounding the exterior of the processing container 44. The processing container 44 and the cover container 46 are both composed of quartz which is resistant to heat, and are coaxially arranged in a double tube structure. The interior of the processing container 44 serves as a processing space 45 in which semiconductor wafers W are to be housed.

The ceiling portion of the processing container 44 is formed flatly. A nozzle housing area 48 for housing the below-described gas nozzles is formed on one side of the processing container 44 along the longitudinal direction. As shown in FIG. 2, the nozzle housing area 48 is formed inside an outwardly-bulging portion 50 of the side wall of the processing container 44.

A slit-like exhaust port 52 (see FIG. 3), whose width L1 is constant along the longitudinal direction (vertical direction), is formed in the side wall of the processing container 44 at a position opposite the nozzle housing area 48 so that the atmosphere in the processing container 44 can be exhausted. To perform evacuation smoothly, the length of the slit-like exhaust port 52 is made equal to or longer than the length of the support structure 38; the upper end of the exhaust port 52 is at the same or a higher level than the upper end of the support structure 38, and the lower end of the exhaust port 52 is at the same or a lower level than the lower end of the support structure 38.

The width L1 of the slit-like exhaust port 52 may preferably be in the range of 15 to 30 mm, for example. As shown in FIG. 4, a vertically extending exhaust space 53, bulging outward in an arc to locally increase the volume of the cover container 46, is formed along the side wall of the cover container 46 at a position corresponding to the slit-like exhaust port 52 so that evacuation can be performed smoothly.

The lower end of the processing container 44 and the lower end of the cover container 46 are supported by a cylindrical manifold 54 e.g. made of stainless steel. The cylindrical manifold 54 comprises a part of the processing container structure 34.

The manifold 54 has, at its upper end, a flange portion 56 on which the lower end of the cover container 46 is mounted and supported. A sealing member 58, such as an O-ring, is interposed between the flange portion 56 and the lower end of the cover container 46 to keep the interior of the cover container 46 in a hermetic condition. Further, a ring-shaped support portion 60 is provided on an upper portion of the interior wall of the manifold 54, and the lower end of the processing container 44 is mounted and supported on the support portion 60. The lid 36 is hermetically mounted to the bottom opening of the manifold 54 via a sealing member 62, such as an O-ring, to hermetically close the bottom opening side of the processing container structure 34, i.e. the opening of the manifold 54. The lid 36 is, for example, formed of stainless steel.

A rotating shaft 66, penetrating though the lid 36, is provided via a magnetic fluid sealing portion 64 in the center of the lid 36. The lower end of the rotating shaft 66 is rotatably supported on the arm 68A of a lifting means 68 comprised of a boat elevator. The rotating shaft 66 is rotated by means of a not-shown motor. A rotating plate 70 is provided on the upper end of the rotating shaft 66. The support structure 38 for holding wafers W is placed on the rotating plate 70 via a quartz heat-retaining stand 72. Thus, the lid 36 moves vertically together with the support structure 38 by vertically moving the lifting means 68, so that the support structure 38 can be inserted into and withdrawn from the processing container structure 34.

The quartz heat-retaining stand 72 includes four support posts 76 (only two posts are shown in FIGS. 1 and 4) mounted in an upright position on a base 74 and on which the support structure 38 is mounted and supported. The support posts 76 are provided with a plurality of heat-retaining plates 78 arranged at appropriate intervals in the longitudinal direction of the support posts 76.

As described above, the entire support structure 38 is formed of quartz which is heat resistant. The support structure 38 includes a top plate portion 80 located at the upper end of the structure, a bottom portion 82 located at the lower end of the structure, and a plurality of support posts 84 which connect the top plate portion 80 and the bottom portion 82 and which support wafers W in multiple stages. In this embodiment, the support posts 84 consist of three support posts 84A, 84B, 84C (see FIG. 2) which are arranged at equal intervals along the semicircular arc portion of the circular contour of a wafer W.

Transfer of wafers is performed from the other semicircular arc side where the support posts 84A to 84C are not provided. Plate-like quartz reinforcing support posts 86 (see FIG. 2), connecting the top plate portion 80 and the bottom portion 82, are provided approximately midway between the support posts 84A and 84B and between the support posts 84B and 84C to increase the strength of the support structure (wafer boat) 38.

Support portions 88, comprised of support grooves, for supporting wafers W are formed on the inner side of each of the three support posts 84A to 84C at a predetermined pitch P1 along the longitudinal direction. Wafers W can be supported in multiple stages by placing peripheral portions of the wafers W on the support portions 88. The diameter of the wafers W is, for example, 300 mm, and a maximum of about 50 to 150 wafers W can be supported in the support structure 38. The pitch P1 may be generally in the range of about 5.0 to 16 mm, and in this embodiment is set at about 6.5 mm. The volume of the processing container 44 is, for example, in the range of about 120 to 150 liters, and in this embodiment is set at about 130 liters so that about 100 wafers can be housed in the processing container 44.

On the other hand, the gas introduction means 40 for introducing a gas into the processing container 44 is provided in the manifold 54. More specifically, the gas introduction means 40 includes a plurality of, for example three as depicted, quartz gas nozzles 90, 92, 94. The gas nozzles 90 to 94 are disposed in the processing container 44 along the longitudinal direction, and the base end portions of the gas nozzles, bent in a letter "L" shape, penetrate through the manifold 54 and are thus supported.

As shown in FIG. 2, the gas nozzles 90 to 94 are disposed in the nozzle housing area 48 of the processing container 44 in a line along the circumferential direction. Gas holes 90A, gas holes 92A and gas holes 94A are formed in the gas nozzles 90, 92 and 94, respectively, at a predetermined pitch along the longitudinal direction of the nozzles so that a gas can be ejected in a horizontal direction from each of the gas holes 90A to 94A. The predetermined pitch of the gas holes 90A to 94A is set equal to the pitch of the wafers W supported in the support structure 38, and the height position of each of the gas holes 90A to 94A is set to lie midway between vertically adjacent wafers W so that the respective gases can be supplied effectively to the spaces between the wafers W.

Examples of usable gases may include a raw material gas, a reactive gas and a purge gas. Such gases can be supplied as necessary though the gas nozzles 90 to 94 while controlling the flow rate of each gas. In this embodiment zirconium tetramethyl is used as a raw material gas, ozone which is an oxidizing gas is used as a reactive gas, and $N_2$ gas is used as a purge gas to form a ZrOx film by ALD method. The type of a gas to be used should, of course, be changed according to the type of a film to be formed.

A first gas outlet 96 is formed in an upper portion of the side wall of the manifold 54 and above the support portion 60 and a second gas outlet 98, having a larger diameter than the first gas outlet 96, is formed in the ceiling portion of the cover container 46 so that the atmosphere in the processing container 44, exhausted from the exhaust port 52 into the space between the processing container 44 and the cover container 46, can be exhausted out of the system from the first and second gas outlets 96, 98. The first gas outlet 96 is provided with the first exhaust system 41A comprising a part of the exhaust means 41, and the second gas outlet 98 is provided with the second exhaust system 41B comprising a part of the exhaust means 41. More specifically, as shown also in FIG. 5A, the first exhaust system 41A includes an exhaust passage 100 which is connected to the first gas outlet 96 and in which a pressure regulating valve 102 and a first vacuum pump 104 are interposed for vacuuming.

The pressure regulating valve 102 is completely closable and is capable of adjusting the degree of opening to adjust the pressure in the processing container 44. The evacuation capacity of the first vacuum pump 104 is, for example, about 30000 liters/min. A pipe, e.g. having an inside diameter of 3 to 4 inches (1 inch=2.54 cm), can be used as the exhaust passage 100. A conventional common exhaust system may be used as the first evacuation system 41A.

As shown also in FIG. 5B, the second exhaust system 41B includes an exhaust passage 106 which is connected to the second gas outlet 98 and in which an on-off valve 108 and a second vacuum pump 110 are interposed for vacuuming. The on-off valve 108 may be one capable of adjusting the degree of opening in a stepwise manner. The evacuation capacity of the second vacuum pump 110 is set significantly higher than that of the first vacuum pump 104, for example, at about 80000 to 160000 liters/min so that the processing container 44 can be evacuated quickly and efficiently even when a large amount of gas is supplied into the processing container 44.

The inside diameter of the exhaust passage 106 is therefore set significantly larger than that of the exhaust passage 100 of the first exhaust system 41A. A pipe, e.g. having an inside diameter of 8 inches, is used as the exhaust passage 106 in this embodiment. As will be described later, the second exhaust system 41B is to be used for evacuation during a purge step in the formation of a film by ALD method. In order to prevent a lowering of the exhaust conductance upon the supply of a purge gas at a high flow rate, the exhaust passage 106 of the second exhaust system 41B should preferably have an inside diameter of not less than 6 inches, more preferably not less than 8 inches.

Returning to FIG. 1, the heating means 42 for heating the wafers W has a cylindrical shape, surrounding the outer periphery of the cover container 46. The overall operation of the thus-constructed processing apparatus 32, such as the start/stop of the supply of each gas, control of the gas introduction means 40, the exhaust means 41 and the heating means 42, etc., is controlled by a control means 112 e.g. comprised of a computer. A computer program for performing the operation is stored in a storage medium 114 such as a flexible disk, a CD (compact disk), a hard disk, a flash memory or a DVD.

<Operation of the Processing Apparatus>

Figure 6:
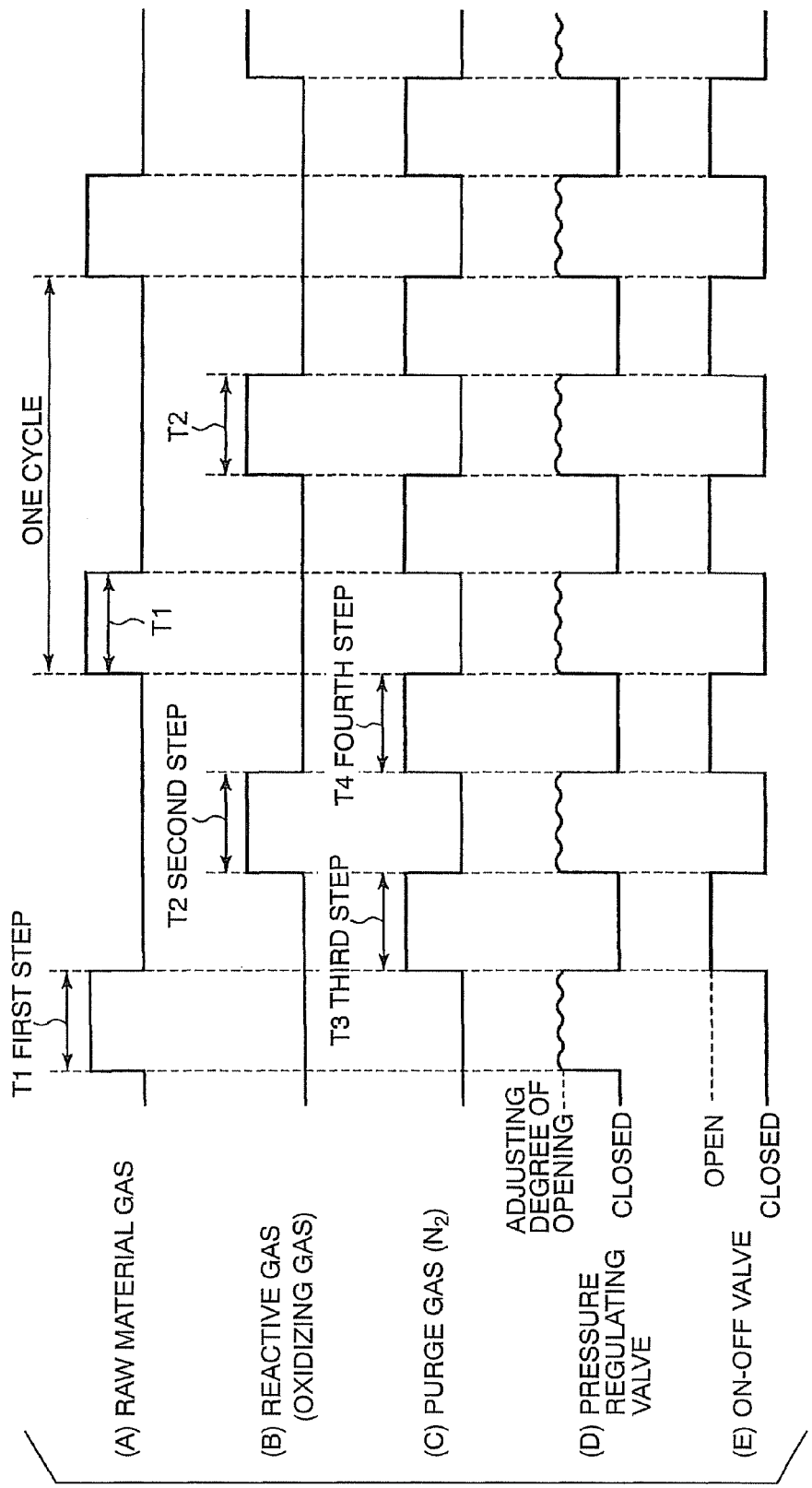
FIG. 6 is a timing chart showing the relationship between the manner of supply of gases and the operation of valves of the exhaust means.

A film-forming processing, carried out by using the thus-constructed processing apparatus 32, will now be described with reference also to FIG. 6. FIG. 6 is a timing chart showing the relationship between the manner of supply of each gas and the operation of the valves of the exhaust means. The following description illustrates the formation of a film, e.g. a ZrOx film, by the ALD method comprising a repetition of the cycle of supplying a raw material gas, e.g. zirconium tetramethyl, and a reactive gas, e.g. ozone, each in a pulsed manner for a predetermined time period. $N_2$ gas, for example, is used as a purge gas.

First, the support structure 38 comprised of a wafer boat, holding a large number of, for example 50 to 150, 300-mm wafers W at room temperature, is raised and loaded into the processing container 44 of the processing container structure 34, which has been brought to a predetermined temperature, and then the processing container 44 is hermetically sealed by closing the bottom opening of the manifold 54 with the lid 36.

While keeping the interior of the processing container 44 at a predetermined processing pressure by continuously vacuuming the processing container 44 by continuously driving the vacuum pumps 104, 110 of the first and second exhaust systems 41A, 41B of the exhaust means 41, the temperature of the wafers W is raised to a processing temperature by increasing the power supplied to the heating means 42, and the processing temperature is maintained. The raw material gas is supplied from the gas nozzle 90 of the gas introduction means 40, the reactive gas (ozone) is supplied from the gas nozzle 92, and the purge gas ($N_2$ gas) is supplied from the gas nozzle 94. More specifically, the raw material gas is ejected horizontally from the gas holes 90A of the gas nozzle 90, the reactive gas is ejected horizontally from the gas holes 92A of the gas nozzle 92, and the purge gas is ejected horizontally from the gas holes 94A of the gas nozzle 94. The raw material gas reacts with the reactive gas to form a ZrOx film on the surfaces of the wafers W supported in the rotating support structure 38.

As shown in FIG. 6, the raw material gas and the reactive gas are supplied alternately and repeatedly in a pulsed manner as described above, and a purge period is provided between every consecutive time periods during which the two processing gases are supplied. The purge gas is supplied during the purge period to promote discharge of the remaining processing gas. The respective gases, ejected from the gas holes 90A to 94A of the gas nozzles 90 to 94, flow horizontally toward the oppositely-located slit-like exhaust port 52 while passing between the wafers W supported in multiple stages, flow through the exhaust port 52 into the exhaust space 53 between the processing container 44 and the cover container 46, and are discharged through the first gas outlet 96 or the second gas outlet 98 to the outside of the processing container structure 34.

Because the gas holes 90A to 94A are arranged such that each gas hole lies at the same level as the space between two adjacent wafers W, the gases flow in substantially laminar flow, without causing a turbulent flow, in the spaces between the wafers W. Referring to FIG. 6, FIG. 6(A) shows the manner of supply of the raw material gas, FIG. 6(B) shows the manner of supply of the reactive gas, and FIG. 6(C) shows the manner of supply of the purge gas. As shown in the figures, the gases are supplied in a pulsed manner such that the first step T1 of supplying the raw material gas and the second step T2 of supplying the reactive gas are alternately repeated a plurality of times, with the purge steps T3, T4 of supplying the purge gas being interposed between each first step T1 and each second step T2. The time period, from the start of supply of the raw material gas to the next start of supply of the raw material gas is herein defined as a cycle, and the number of cycles is controlled according to the thickness of a film to be formed.

When the raw material gas is supplied in the first step T1, the raw material gas adheres to a wafer surface, forming a raw material layer having an atomic or molecular level of thickness. In the subsequent purge step T3, the purge gas is supplied while exhausting the remaining gas. When the reactive gas is then supplied in the second step T2, the reactive gas reacts with the raw material layer to form a film. In the subsequent purge step T4, the purge gas is supplied while exhausting the remaining gas. Upon completion of the cycle, a one-layer film, having an atomic or molecular level of thickness, is thus formed on the wafer surface. The film is grown by repeating the cycle operation.

According to the film forming method of the present invention, in order to quickly and efficiently discharge the remaining gas (including a gas produced by the reaction), the two exhaust systems are provided in the processing apparatus and, in addition, the purge gas is supplied at a high flow rate. FIG. 6(D) shows the operation of the pressure regulating valve 102 of the first exhaust system 41A, and FIG. 6(E) shows the operation of the on-off valve 108 of the second exhaust system 41B.

As shown in the figures, during the first step of supplying the raw material gas and the second step of supplying the reactive gas, the on-off valve 108 is completely closed so that the gas will not flow through the second exhaust system 41B, while the degree of opening of the pressure regulating valve 102 is adjusted to control the pressure in the processing container 44 while exhausting the gas from the first exhaust system 41A. The gas flow rate is low in the first and second steps; for example, the flow rate of the raw material gas is about 20 sccm, and the flow rate of the reactive gas is about 20 sccm. The processing pressure is, for example, 0.5 to 2.0 Torr in the first and second steps.

On the contrary, during the purge steps T3, T4, the pressure regulating valve 102 is completely closed so that the gas will not be exhausted from the first exhaust system 41A, while the on-off valve 108 is opened to exhaust the purge gas and the remaining gas from the second exhaust system 41B. The flow rate of the purge gas is significantly higher than those of the raw material gas and the reactive gas. For example, the purge gas may be supplied at a flow rate of about 1 liter/min per wafer. Thus, assuming that 100 wafers W are housed in the processing container 44, the purge gas will be supplied at a high flow rate of about 100 liters/min.

As described above, with the provision of the second exhaust system 41B including the large-diameter exhaust passage 106 and the vacuum pump 110 having a large evacuation capacity, the purge gas and the remaining gas in the processing container 44 can be exhausted quickly and efficiently even though the purge gas is supplied at a high flow rate. Thus, despite the supply of the purge gas at a high flow rate, the interior of the processing container 44 can be kept in a reduced pressure atmosphere, for example at a pressure of about 1 Torr or lower.

Therefore, it becomes possible to satisfactorily form a high-quality film by ALD method even for a wafer having surface irregularities whose aspect ratio is as high as about 40. The pressure regulating valve 102 is closed during the purge steps T3, T4 for the following reason: The evacuation capacity of the second vacuum pump 110 of the second exhaust system 41B is considerably larger than the first vacuum pump 104. Accordingly, if the pressure regulating valve 102 is open during the purge steps, it is possible that a gas, containing particles, etc., may flow backward from the first exhaust system 41A. The pressure regulating valve 102 should be closed to prevent such phenomenon.

As regards the evacuation of the purge gas, the exhaust space 53, bulging outward in an arc, is provided along the side wall of the cover container 46 at a position corresponding to the slit-like exhaust port 52 so as to prevent a lowering of the exhaust conductance in that area. This makes it possible to evacuate the purge gas and the remaining gas more quickly and efficiently. The purge gas is not limited to $N_2$ gas; a rare gas such as He may also be used.

With the provision of the exhaust means 41 including the two exhaust systems 41A, 41B for evacuation of the atmosphere in the processing container 44, it becomes possible to enhance the evacuation capacity, making it possible to quickly and efficiently bring the interior of the processing container 44 to a reduced pressure atmosphere even when a gas is supplied at a high flow rate into the processing container 44.

<Simulation with 8-Inch Pipe>

Figure 7A:
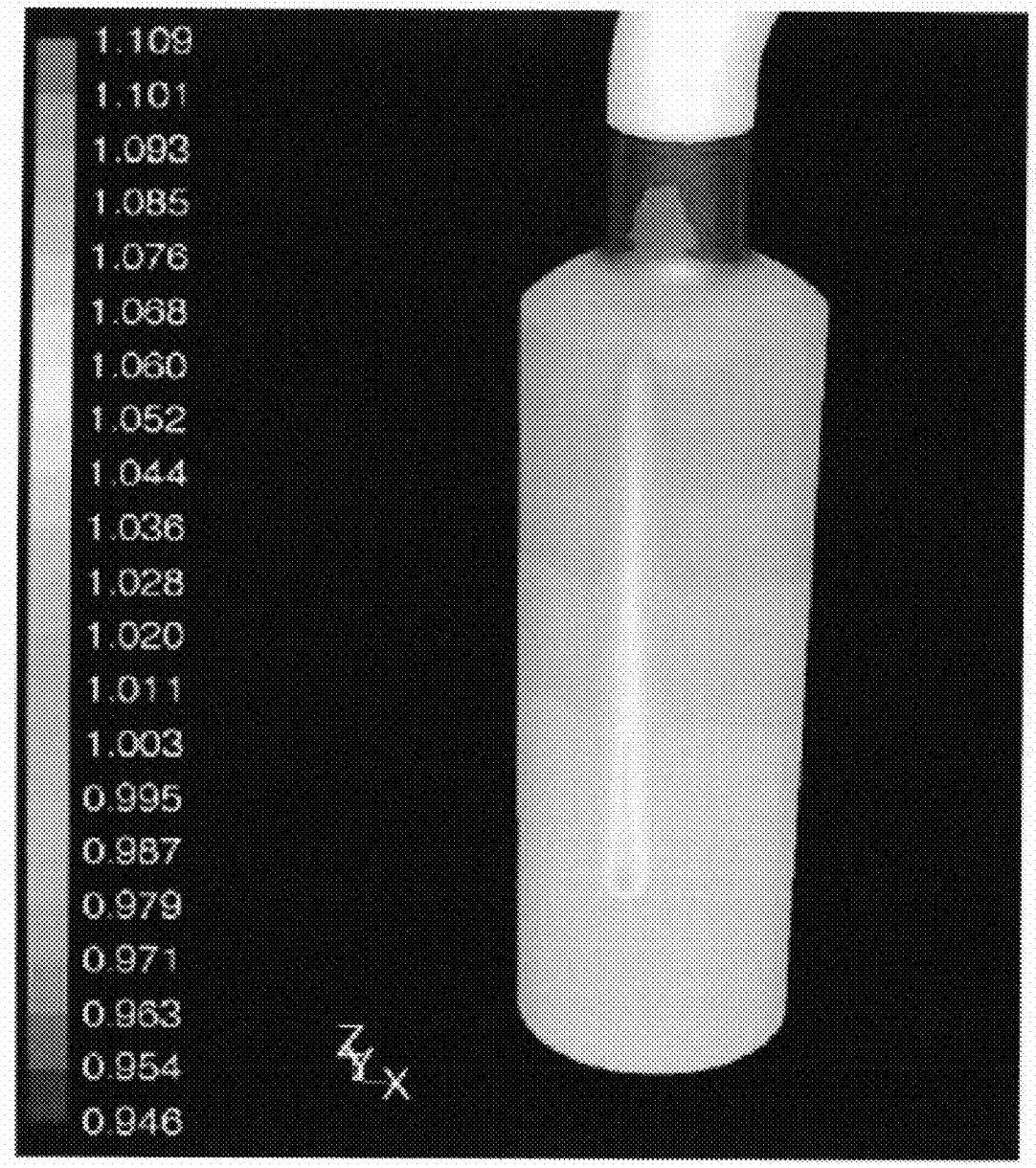
FIGS. 7A and 7B are diagrams showing the results of a simulation with an 8-inch pipe.
Figure 7B:
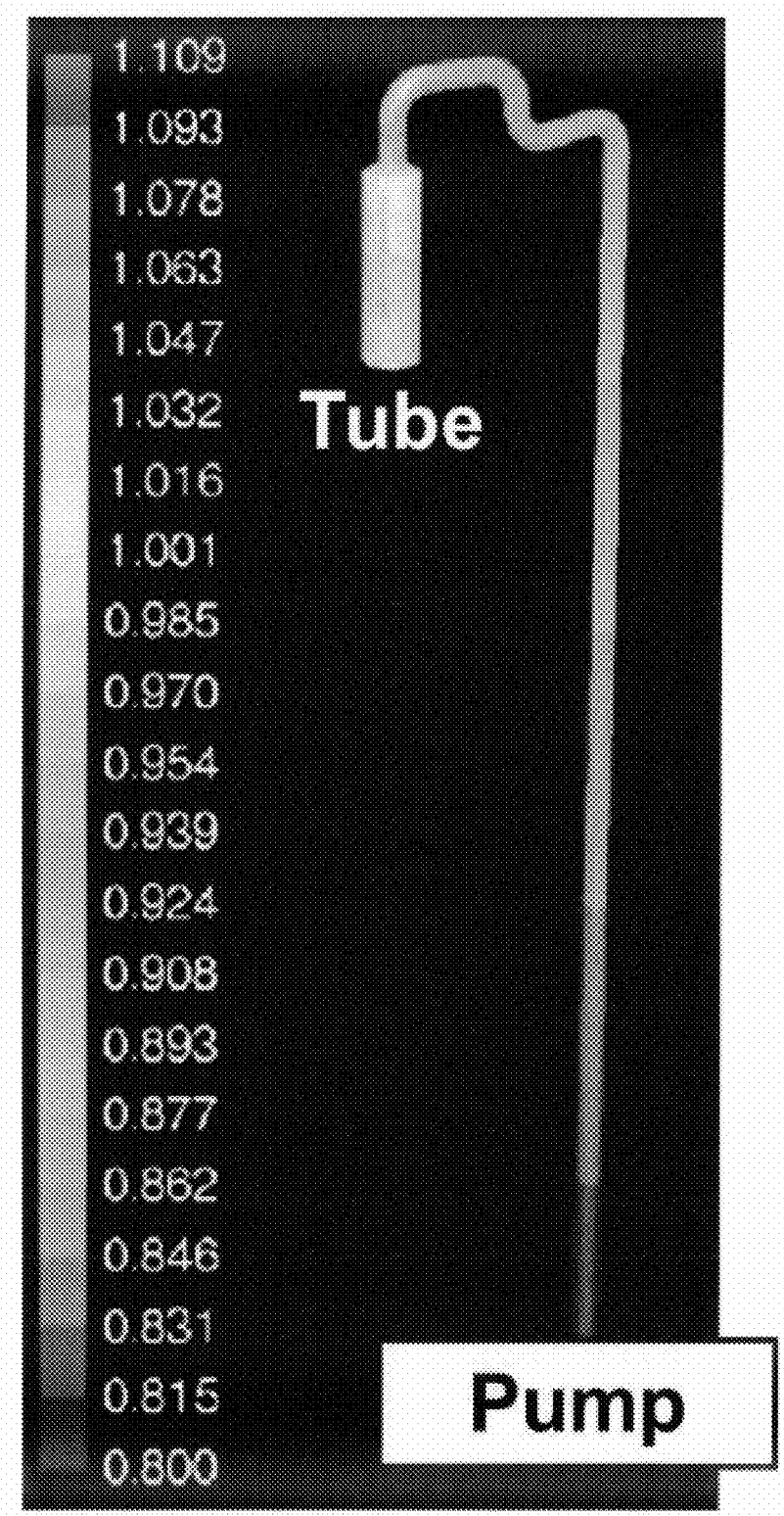

A vacuuming simulation was conducted using an 8-inch pipe as the exhaust passage 106. FIGS. 7A and 7B are diagrams showing the results of the simulation, FIG. 7A showing a pressure distribution in a processing container (Tube) and FIG. 7B showing a pressure distribution in the 8-inch pipe upon vacuuming by means of a vacuum pump (Pump). In the simulation, the volume of the processing container was set at 130 liters, $N_2$ gas as a purge gas was supplied at a flow rate of 100 slm, the length of the 8-inch pipe was set at 10 m, and the evacuation capacity of the vacuum pump was set at 16000 liters/min. The simulation results verify that the pressure in the processing container (Tube) can be reduced to approx. 1 Torr.

<Simulation for Evaluation of the Width of the Slit-Like Exhaust Port>

Figure 8:
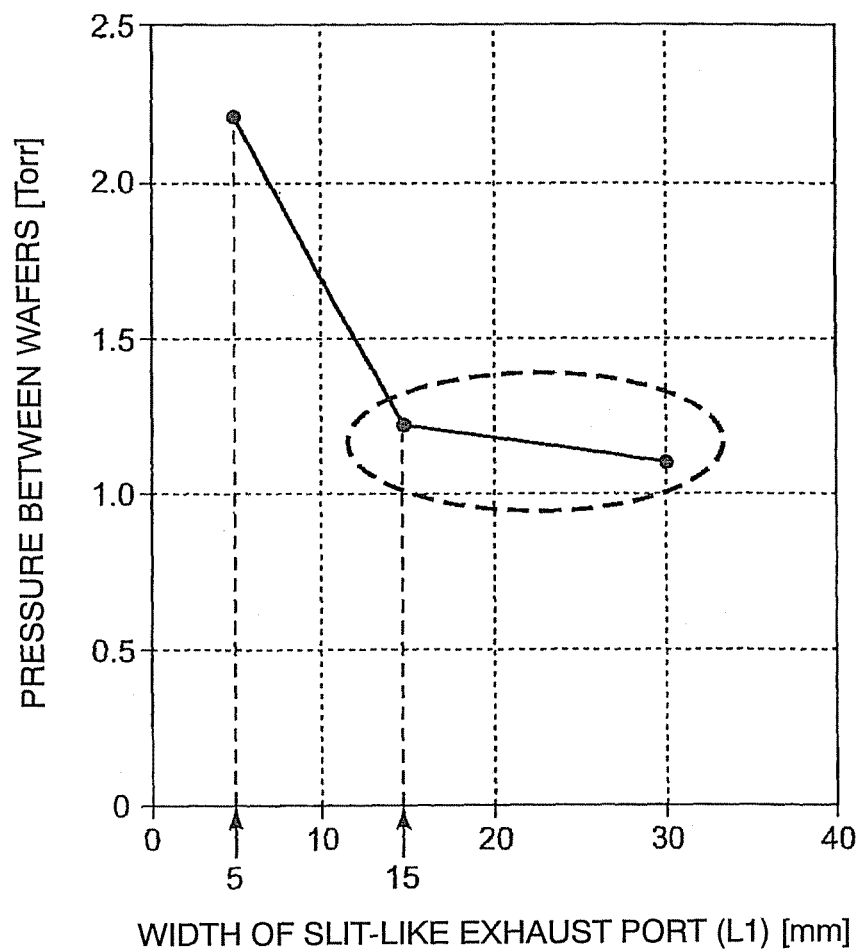
FIG. 8 is a graph showing the relationship between the width of a slit-like exhaust port and the pressure between wafers.

A simulation was conducted to determine a change in the pressure between wafers (in processing container) as the width L1 of the slit-like exhaust port 52 is varied. FIG. 8 is a graph showing the relationship between the width of the slit-like exhaust port and the pressure between wafers. In the simulation, using the same processing container as shown in FIGS. 7A and 7B, $N_2$ gas as a purge gas was supplied at a flow rate of 100 slm. The width L1 of the slit-like exhaust port 52 was varied in the range of 5 to 30 mm.

As can be seen in FIG. 8, when the width L1 of the exhaust port 52 is in the range of 5 to 15 mm, the pressure between wafers decreases linearly and rapidly with increase in the width L1, with the minimum value being about 1.2 Torr. When the width L1 exceeds 15 mm, on the other hand, the decrease in the pressure between wafers is very moderate: the pressure between wafers decreases little by little and approximately reaches saturation when the width L1 is in the range of 15 to 30 mm. The data thus indicates that the width L1 of the exhaust port 52 is preferably set in the range of 15 to 30 mm.

Second Embodiment

Though in the preceding embodiment the processing container structure has a double tube structure consisting of the inner processing container 44 and the cover container 46 that surrounds the exterior of the container 44, the present invention is not limited to such a double tube structure. Thus, the present invention may be applied to a processing container structure of a single tube structure as disclosed e.g. in Japanese Patent Laid-Open Publication No. 2008-227460.

Figure 9:
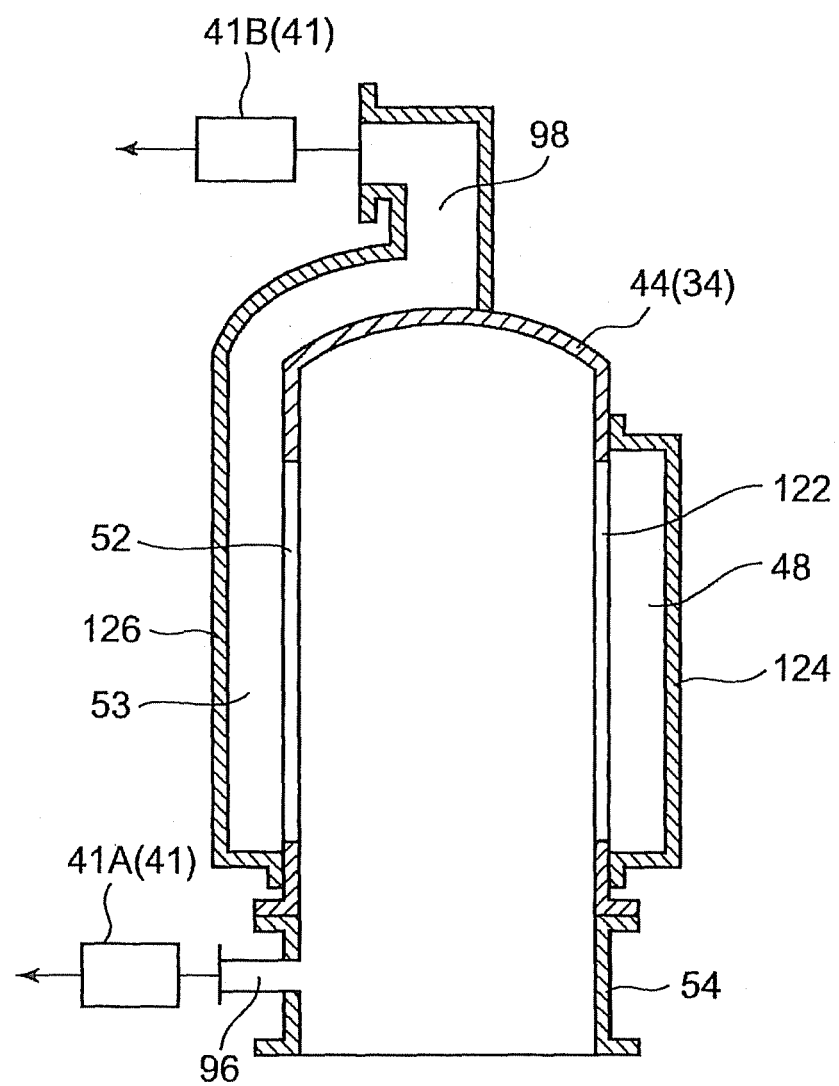
FIG. 9 is a schematic view of a processing container structure according to a second embodiment of the present invention.

FIG. 9 shows a schematic view of a processing container structure according to a second embodiment of the present invention. Only the processing container structure is shown in FIG. 9, illustration of the other portion being omitted. The processing container structure of this embodiment comprises a processing container 44 of a single tube structure. The processing container 44 has on one side a vertically extending opening 122 and a compartment wall 124 that covers the opening 122. A nozzle housing area 48 is formed between the opening 122 and the compartment wall 124. A slit-like exhaust port 52 is formed in the wall of the processing container 44 in a position opposite the nozzle housing area 48, and an exhaust cover member 126 is provided such that it covers the exhaust port 52. A second exhaust system 41B is connected to a second gas outlet 98 formed at the top of the exhaust cover member 126, and a first exhaust system 41A is connected to a first gas outlet 96 formed in a manifold 54.

In the case of a processing container structure having a single tube structure, the container structure may be comprised solely of a quartz processing container without a manifold. The present invention, when applied to such a processing container structure, can achieve the same advantageous effects as describe above.

While the formation of a ZrOx film has been described by way of example, the present invention can be applied to the formation of any type of film insofar as the film is formed by ALD involving the purge step of supplying a purge gas. Though in the preceding embodiment the first exhaust system 41A and the second exhaust system 41B are provided respectively at the top and at the bottom of the processing container structure, it is also possible to design the first gas outlet 96 and the second gas outlet 98 such that the former is larger than the latter, and to connect the second exhaust system 41B to the first gas outlet 96 and connect the first exhaust system 41A to the second gas outlet 98.

The present invention can also be applied to film-forming processing using a plasma. In that case, an electrode plate for application of a plasma-generating high frequency power is provided, for example, outside and along the longitudinal direction of the compartment wall of the raised portion 50 defining the nozzle housing area 48.

Semiconductor wafer as processing objects, usable in the present invention, include silicon wafers and compound semiconductor substrates such as GaAs, SiC, GaN, etc. The present invention can also be applied to other types of substrates, such as glass or ceramic substrates for use in liquid crystal display devices.

<Comparative Apparatus>

Figure 10:
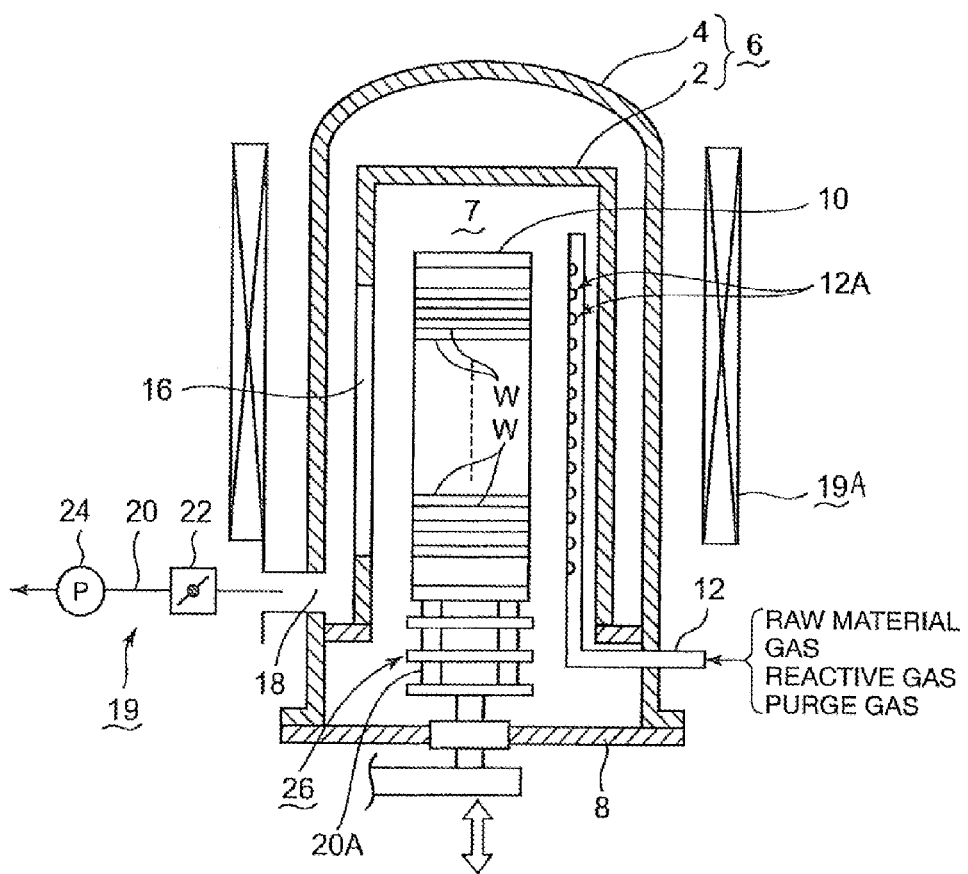
FIG. 10 is a schematic view of an exemplary comparative batch processing apparatus.

A comparative batch processing apparatus will now be described. FIG. 10 shows a schematic view of an exemplary comparative batch processing apparatus. As shown in FIG. 10, the batch processing apparatus includes a processing container structure 6 consisting of a closed-top quartz processing container 2, and a closed-top quartz cover container 4 concentrically surrounding the circumference of the processing container 2. The interior of the processing container 2 serves as a processing space 7. The bottom opening of the processing container structure 6 is openable and hermetically closable by a lid 8.

A quartz wafer boat 10, holding wafers W in multiple stages, is housed in the processing container 2. The wafer boat 10 can be inserted upwardly into and withdrawn downwardly from the processing container structure 6. A gas nozzle 12 is inserted into the processing container 2 from its bottom. The gas nozzle 12 has a large number of gas holes 12A arranged in the longitudinal direction of the nozzle, and a necessary gas can be horizontally ejected from the gas holes 12A at a controlled flow rate. Though only one gas nozzle is illustrated, a plurality of, for example three, gas nozzles are actually provided according to the types of gases used.

A vertically extending slit-like exhaust port 16 is formed in the side wall of the processing container 2 at a position opposite the gas nozzle 12. A gas, exhausted from the exhaust port 16, can be exhausted out of the system from a gas outlet 18 provided in a lower portion of the side wall of the cover container 4. An exhaust system 19 is connected to the gas outlet 18. The exhaust system 19 includes an exhaust passage 20 which is connected to the gas outlet 18 and in which a pressure regulating valve 22 and a vacuum pump 24 are interposed. A cylindrical heater 19A for heating the wafers W supported in the wafer boat 10 is provided around the outer periphery of the processing container structure 6. The wafer boat 10 is placed on a heat-retaining stand 26 including a plurality of quartz support posts 20A.

In the processing apparatus, a film is deposited by ALD on the surface of each wafer W by horizontally ejecting a raw material gas and a reactive gas which reacts with the raw material gas to form the film, for example an oxidizing gas, alternately and repeatedly from the gas holes 12A of the gas nozzle 12. A purge gas such as $N_2$ gas is supplied during the intervals between the supply of the raw material gas and the supply of the reactive gas to discharge the remaining gas. The gases in the processing container 2 are discharged from the slit-like exhaust port 16, and finally discharged out of the system from the gas outlet 18 provided in a lower portion of the side wall of the cover container 4.

These days semiconductor devices are often formed in multiple layers on a semiconductor wafer. The aspect ratio of the surface irregularities of such a wafer is as high as about 40. In addition, the line width and the trench width are becoming increasingly finer. When forming a film by ALD on such a wafer, in order to achieve high throughput, a gas remaining in the processing container 2 and a gas produced by a film-forming reaction must be quickly and efficiently exhausted in the purge step, performed between the supply of a raw material gas and the supply of a reactive gas, so that the pressure in the processing container 2 will be quickly reduced to approx. 1 Torr at which the mean free path of gas molecules is sufficiently long. In order to efficiently exhaust the remaining gas and the by-product gas, the purge gas needs to be supplied in a large amount into the processing container 2 for replacement of the internal atmosphere with the purge gas.

The exhaust system 19 of the above-described comparative processing apparatus uses the exhaust passage 20 having an inside diameter of about 3 to 4 inches (1 inch=2.54 cm). Such a conventional exhaust system is not capable of quick vacuuming because of insufficient evacuation capacity. Especially for quick gas replacement in the processing container 2, a purge gas needs to be supplied at a high flow rate such as 1 liter/min per wafer and, therefore, there has been a demand for a processing apparatus which can well deal with the supply of such a large amount of purge gas.

The present invention enables enhancement of evacuation capacity as described above, making it possible to quickly and efficiently bring the interior of a processing container to a reduced pressure atmosphere even when a gas is supplied at a high flow rate into the processing container.

What is claimed is:

1. A processing apparatus for carrying out predetermined processing of a plurality of processing objects, comprising:
a processing container structure having a bottom opening and including a processing container having a processing space for housing the processing objects and a cover container surrounding an exterior of the processing container, said processing container having a nozzle housing area on one side of the processing space and a slit-like exhaust port on the opposite side of the processing space from the nozzle housing area;
a lid configured to close the bottom opening of the processing container structure;
a support structure configured to support the processing objects and can be inserted into and withdrawn from the processing container structure;
a gas introduction means including a gas nozzle housed in the nozzle housing area;
an exhaust means including a plurality of exhaust systems for exhausting the atmosphere in the processing container structure;
a heating device configured to heat the processing objects; and
a control device configured to control the gas introduction means, the exhaust means and the heating device,
wherein an exhaust space is formed on an outer side of the slit-like exhaust port and on an inner side of the cover container,
wherein the plurality of exhaust systems comprise a first exhaust system provided at a bottom of the cover container and a second exhaust system provided at a top of the cover container, the first exhaust system provided with a first vacuum pump and the second exhaust system provided with a second vacuum pump,
wherein a gas ejected from the gas nozzle flows toward the slit-like exhaust port into the exhaust space between the processing container and the cover container, and is discharged through at least one of the first exhaust system and the second exhaust system to an outside of the processing container structure,
wherein the cover container surrounds an entirety of the exterior of the processing container in a circumferential direction and comprises a cylindrical portion and an exhaust space forming portion bulging outwardly in an arc from the cylindrical portion so as to form the exhaust space,
wherein the exhaust space forming portion is formed along a side wall of the cover container at a position facing the slit-like exhaust port, and
wherein the exhaust space forming portion extends from the first exhaust system to the second exhaust system and is in communication with the first exhaust system and the second exhaust system.

2. The processing apparatus according to claim 1, wherein the first exhaust system and the second exhaust system each include an exhaust passage, and the inside diameter of one of the exhaust passages of the first and second exhaust systems is relatively larger than that of the other one.

3. The processing apparatus according to claim 2, wherein the exhaust system including the exhaust passage having a relatively large inside diameter has an on-off valve capable of opening and closing the exhaust passage having a relatively large inside diameter, and the exhaust system including the exhaust passage having a relatively small inside diameter has a pressure regulating valve whose degree of opening is controllable.

4. The processing apparatus according to claim 3, wherein the inside diameter of the exhaust passage having a relatively large inside diameter is not less than 8 inches.

5. The processing apparatus according to claim 1, wherein the width of the slit-like exhaust port is in the range of 15 to 30 mm.

6. The processing apparatus according to claim 1, wherein the volume of the processing container is set such that the maximum number of the processing objects that can be housed in the processing container is in the range of 50 to 150.

7. The processing apparatus according to claim 1, wherein the diameter of the processing objects is not less than 300 mm.

8. The processing apparatus according to claim 1, wherein the predetermined processing comprises carrying out a first step of supplying a raw material gas into the processing container and a second step of supplying a reactive gas into the processing container alternately and repeatedly, with a purge step of supplying a purge gas into the processing container being interposed between each first step and each second step, and wherein the control device controls the exhaust means such that in the first or second step, the atmosphere in the processing container is exhausted by using at least one of the plurality of exhaust systems and, in the purge step, the atmosphere in the processing container is exhausted by using at least one other exhaust system of the plurality of exhaust systems.

9. The processing apparatus according to claim 1, wherein the evacuation capacity of the second vacuum pump is at 80000 to 160000 liters/min.

10. The processing apparatus according to claim 1, wherein an evacuation capacity of the second vacuum pump is set higher than that of the first vacuum pump.

* * * * *